(12) United States Patent  
Sanders

(10) Patent No.: US 7,798,867 B2
(45) Date of Patent: Sep. 21, 2010

(54) ENVIRONMENTALLY SEALED CONTACT

(75) Inventor: David L. Sanders, Camden Point, MO (US)

(73) Assignee: Interconnect Devices, Inc., Kansas City, KS (US)

( * ) Notice: Subject to any disclaimer, the term of this patent is extended or adjusted under 35 U.S.C. 154(b) by 0 days.

(21) Appl. No.: 12/269,235

(22) Filed: Nov. 12, 2008

(65) Prior Publication Data

US 2010/0120301 A1 May 13, 2010

(51) Int. Cl.
*H01R 13/24* (2006.01)
(52) U.S. Cl. ............................ 439/700; 439/824
(58) Field of Classification Search .............. 439/824, 439/700, 660; 324/754
See application file for complete search history.

(56) References Cited

U.S. PATENT DOCUMENTS

| | | | | |
|---|---|---|---|---|
| 3,771,110 | A * | 11/1973 | Reed | 439/737 |
| 4,625,442 | A * | 12/1986 | Hill et al. | 42/1.12 |
| 4,783,624 | A | 11/1988 | Sabin | |
| 4,936,842 | A | 6/1990 | D'Amelio et al. | |
| 6,070,997 | A * | 6/2000 | Duke et al. | 362/500 |
| 6,323,667 | B1 | 11/2001 | Kazama | |
| 6,398,592 | B1 * | 6/2002 | Mori et al. | 439/700 |
| 6,696,850 | B1 | 2/2004 | Sanders | |
| 6,773,130 | B1 | 8/2004 | Richardson | |
| 7,008,270 | B1 * | 3/2006 | Huh et al. | 439/700 |
| 7,052,297 | B2 | 5/2006 | Panzar et al. | |
| 7,249,661 | B2 * | 7/2007 | Becocci et al. | 188/344 |
| 2006/0043988 | A1 | 3/2006 | Cram et al. | |
| 2006/0125502 | A1 | 6/2006 | Lindsey et al. | |
| 2006/0139042 | A1 | 6/2006 | Kasukabe | |
| 2006/0250151 | A1 | 11/2006 | Cram et al. | |
| 2006/0261828 | A1 | 11/2006 | Cram et al. | |
| 2008/0061808 | A1 | 3/2008 | Mok et al. | |
| 2008/0100325 | A1 | 5/2008 | Sinclair | |
| 2008/0257027 | A1 * | 10/2008 | Wu | 73/146.8 |

FOREIGN PATENT DOCUMENTS

| | | |
|---|---|---|
| JP | 2003107130 | 4/2003 |
| JP | 2005009927 | 1/2005 |
| WO | 03090249 A2 | 10/2003 |

OTHER PUBLICATIONS www.connect2it.com/pdfs/pneumatic_contact.pdf, Connect2it, "Series 90 Pneumatic Contacts". pp. 96-102, downloaded Nov. 12, 2008.

* cited by examiner

*Primary Examiner*—Michael C Zarroli
(74) *Attorney, Agent, or Firm*—Finnegan, Henderson, Farabow, Garrett & Dunner LLP

(57) ABSTRACT

A contact probe assembly may include a cylindrical member including a barrel having a first opening located at a first end of the barrel and a second opening located at a second end of the barrel. The contact probe assembly may also have a plunger having a first end and second end. The first end of the plunger may be adapted to be removably received by the second opening of the barrel. The contact probe assembly may also include a cap having at least one o-ring. The cap may be configured to interconnect with the second end of the barrel such that the o-ring seals a gap between the plunger and the barrel. The contact probe assembly may have a plug that may be adapted to be removably received by the first opening of the barrel. The plug may be configured to seal the first opening.

11 Claims, 2 Drawing Sheets

ENVIRONMENTALLY SEALED CONTACT

BACKGROUND

Contact probes are known in the art and described in, for example, U.S. Pat. No. 4,783,624. It is common for contact probes to be used in a variety of electrical testing applications. For example, contact probes may be used to provide electrical contact between testing equipment and devices to be tested. In addition, contact probes may be used to provide reliable contact between battery chargers and devices, circuits and devices, mating devices and/or the like.

Typically, contact probes include sliding parts, such as a barrel, a plunger and/or the like. However, sliding parts often do not provide consistently reliable contact in harsh environments. For example, contaminants, such as dirt, particles, oil and/or the like may infiltrate a contact probe through a gap between parts which can affect the reliability of the contact.

SUMMARY

Before the present methods are described, it is to be understood that this invention is not limited to the particular systems, methodologies or protocols described, as these may vary. It is also to be understood that the terminology used herein is for the purpose of describing particular embodiments only, and is not intended to limit the scope of the present disclosure which will be limited only by the appended claims.

It must be noted that as used herein and in the appended claims, the singular forms "a," "an," and "the" include plural reference unless the context clearly dictates otherwise. Thus, for example, reference to a "sheet" is a reference to one or more sheets and equivalents thereof known to those skilled in the art, and so forth. Unless defined otherwise, all technical and scientific terms used herein have the same meanings as commonly understood by one of ordinary skill in the art. As used herein, the term "comprising" means "including, but not limited to."

In an embodiment, a contact probe assembly may include a cylindrical member including a barrel having a first opening located at a first end of the barrel and a second opening located at a second end of the barrel. The contact probe assembly may also have a plunger having a first end and second end. The first end of the plunger may be adapted to be removably received by the second opening of the barrel. The contact probe assembly may also include a cap having at least one o-ring. The cap may be configured to interconnect with the second end of the barrel such that the o-ring seals a gap between the plunger and the barrel. The contact probe assembly may have a plug that may be adapted to be removably received by the first opening of the barrel. The plug may be configured to seal the first opening.

In an embodiment, a method of preventing contaminants from entering a contact probe may include placing the contact probe in contact with a contact surface. The contact probe may have a barrel and a cap having an o-ring. The cap may be configured to interconnect with a first end of the barrel. The contact probe may have a plunger placed within and extending through the first end of the barrel and the cap. The method may also include applying a force to the contact probe such that the force causes the plunger to move into the barrel. The o-ring may prevent one or more contaminants from entering the barrel as the plunger moves into the barrel.

BRIEF DESCRIPTION OF THE DRAWINGS

Aspects, features, benefits and advantages of the present invention will be apparent with regard to the following description and accompanying drawings, of which.

DETAILED DESCRIPTION

Figure 1:
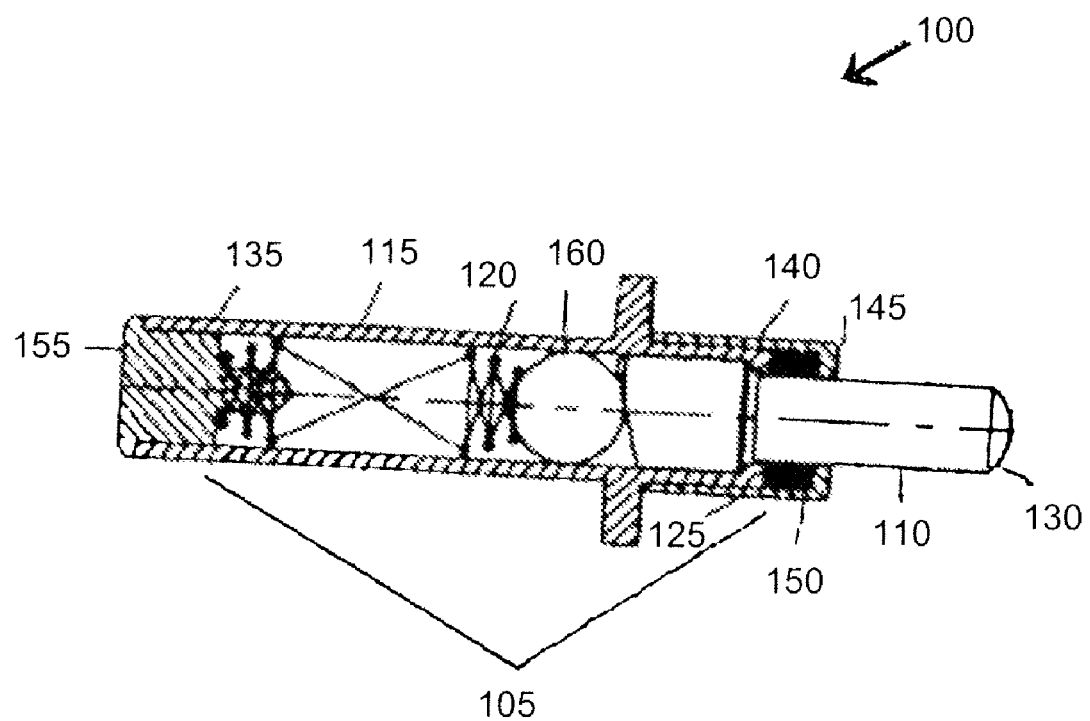
FIG. 1 illustrates an exemplary contact according to an embodiment.

FIG. 1 illustrates an exemplary contact 100 according to an embodiment. In an embodiment, a contact 100 may include a cylinder member 105 and a plunger 110. The cylinder member 105 may include a barrel 115 which may substantially surround a spring 120. In an embodiment, the cylinder member 105 may include a ball 160. The ball 160 may be positioned between the spring 120 and the plunger 110. In an embodiment, the ball 160 may facilitate electrical contact between the plunger 110 and the barrel 115.

In an embodiment, the barrel 115 may be received by the cylinder member 105. For example, the barrel 115 may be removably mounted within the cylinder member 105. In an embodiment, the barrel 115, plunger 110 and/or spring 120 may be fabricated from nickel-silver, gold over nickel plate, brass, beryllium copper and/or any other metals, metal alloys or plating configurations, including, but not limited to, palladium, silver, rhodium, nickel, high phosphorous nickel plating, mid phosphorous nickel plating, sulfamate, 24 kt gold plating, 14 kt gold plating and/or the like.

In an embodiment, the barrel 115 may have a passageway that passes from a first end 135 of the barrel to a second end 140. The barrel 115 may have an opening at both ends 135, 140. In an embodiment, the plunger 110 may be mounted within the barrel 115. As illustrated by FIG. 1, the plunger 110 may have a first end 125 and a second end 130. The first end 125 of the plunger 110 may be removably received by the second end 140 of the barrel 115.

In an embodiment, a contact 100 may include a cap 145. The cap 145 may include at least one o-ring 150. An o-ring 150 may be a flat ring that may form a seal under pressure. In an embodiment, an o-ring 150 may be capable of providing static and/or dynamic seals. An o-ring 150 may be fabricated from plastic, rubber and/or any other suitable material. For example, an o-ring 150 may be fabricated from silicone.

In an embodiment, the o-ring 150 may be removably connected to the cap 145. Alternatively, the o-ring 150 may be integrally formed with the cap 145. In an embodiment, the cap 145 may interconnect with at least a portion of the barrel 115 as illustrated by FIG. 1. The cap 145 may have an opening through which at least a portion of the plunger 110 may pass. In an embodiment, the o-ring 150 may scrub at least a portion of the plunger 110. For example, when the cap 145 is placed on the barrel 115, the o-ring 150 may come into contact with, and scrub a portion of the plunger 110 as it passes through the opening of the cap. In addition, the o-ring 150 may scrub a portion of the plunger 110 as it slides into and out of the barrel 115. The scrubbing may remove debris or other contaminants from the plunger 110 and may prevent entry of contaminants into the barrel 115.

Figure 2:
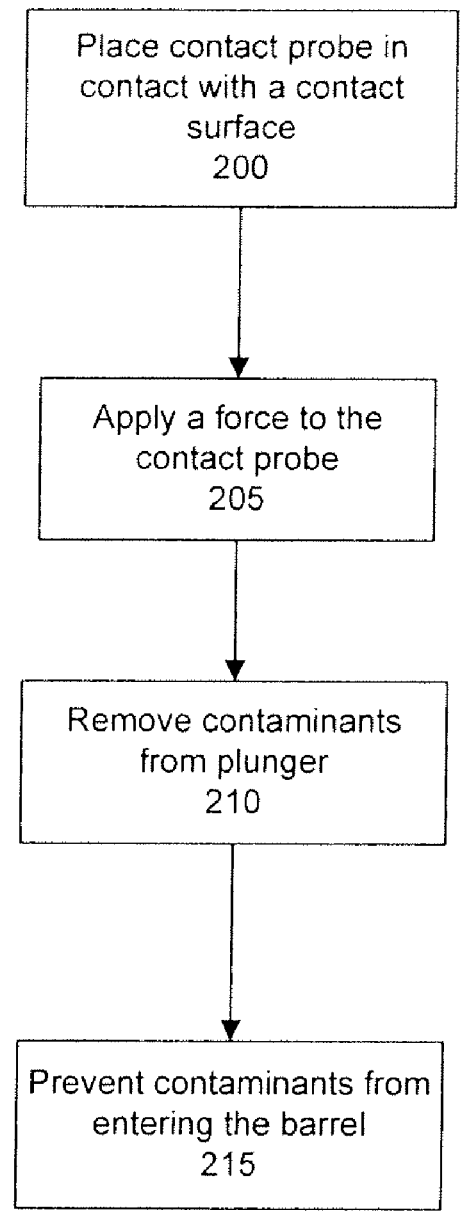
FIG. 2 illustrates an exemplary method of removing contaminants from the plunger according to an embodiment.

FIG. 2 illustrates an exemplary method of removing contaminants from at least a portion of the plunger according to an embodiment. A contact probe may be placed 200 in contact with a contact surface. A contact surface may be a contact side of equipment to be tested and/or the like. In an embodiment, a force may be applied 205 to the contact probe. The force may cause the plunger to slide into the barrel. While the plunger slides into the barrel, the o-ring may remove 210 one or more contaminants from the exterior surface of the plunger. In an embodiment, the o-ring may prevent 215 contaminants from entering the barrel as the plunger slides into the barrel.

Referring back to FIG. 1, the o-ring 150 may seal a gap between the plunger 110 and the barrel 115. In an embodiment, the press fit between the barrel 115 and the cap 145 may seal the point of entry between the plunger 110 and the barrel. As such, the o-ring 150 may prevent contaminants from entering the barrel 115 at the first end 125 of the barrel. In an embodiment, contaminants may include dirt, particles, oil, fluid and/or the like.

In an embodiment, the o-ring 150, cap 145 and plunger 110 may be sized such that compression exists between the o-ring and the cap and the o-ring and the plunger. In an embodiment, the diameter of the barrel 115 may be between approximately 0.030 inches and 0.25 inches. In an embodiment, the diameter of the o-ring 150 may be between approximately 0.024 inches and 0.25 inches. It is understood that other dimensions may be used within the scope of this disclosure.

Compression between the o-ring 150, the cap 145 and the plunger 110 may provide an effective seal against entry of foreign substances at the gap between the plunger and the barrel 115. In an embodiment, this seal may exist for any position of the plunger 110. For example, the seal may exist while the contact 100 is in a compressed state, an uncompressed state and/or the like.

In an embodiment, the fit between the cap 145 and the barrel 115 may be such to allow the plunger 110 to move freely in response to loading and resistance of the spring force, while still providing a seal. In an embodiment, the pressure associated with the seal may be between approximately 1.4 psi and 14 psi. It is understood that other pressures may be used within the scope of this disclosure.

In an embodiment, the contact 100 may include a plug 155. The plug 155 may be connected to the cylinder member 105 at the first end 135 of the barrel 115. The press fit between the barrel 115 and the plug 155 may seal the barrel at the end opposite of the probe opening in case the seal provided by the o-ring 150 is compromised.

In an embodiment, sealing the contact probe 100 may prevent contaminants from entering the barrel 115 and possibly impairing the contact between the plunger 110 and the barrel. For example, contaminants that can be carried via a fluid, such as dirt, oil and the like may leave a residue on the inside of the barrel 115 which impairs the contact between the plunger 110 and the barrel. In addition, the barrel cavity is usually difficult to seal, so fluid and/or contaminants that enter the cavity may cause corrosion of the barrel 115 thereby compromising the performance of the probe 100.

It will be appreciated that various of the above-disclosed and other features and functions, or alternatives thereof, may be desirably combined into many other different systems or applications. It will also be appreciated that various presently unforeseen or unanticipated alternatives, modifications, variations or improvements therein may be subsequently made by those skilled in the art which are also intended to be encompassed by the following claims.

What is claimed is:

1. A contact probe assembly comprising:
   a cylindrical member comprising:
      a spring,
      a ball, and
      a barrel having a first opening located at a first end of the barrel and a second opening located at a second end of the barrel;
   a plunger having a first end and second end, wherein the first end of the plunger is adapted to be removably received by the second opening of the barrel, wherein the ball is located between the spring and the plunger;
   a cap comprising at least one o-ring, wherein the cap is configured to interconnect with the second end of the barrel such that the o-ring seals a gap between the plunger and the barrel; and
   a plug adapted to be removably received by the first opening of the barrel, wherein the plug is configured to seal the first opening.

2. The contact probe of claim 1, wherein the cap comprises an opening configured to surround at least a portion of the plunger.

3. The contact probe of claim 1, wherein the o-ring is integrally formed with the cap.

4. The contact probe of claim 1, wherein the o-ring is removably coupled to the cap.

5. The contact probe of claim 1, wherein the o-ring is fabricated from one or more of:
   plastic;
   rubber; and
   silicone.

6. The contact probe of claim 1, wherein the cap is removably coupled to the barrel.

7. The contact probe of claim 1, wherein the cap is formed integral with the barrel.

8. The contact probe of claim 1, wherein the o-ring is configured to scrub contaminants from at least a portion of the plunger.

9. The contact probe of claim 1, wherein the barrel is fabricated from one or more of the following:
   nickel-silver;
   brass;
   beryllium copper;
   gold over nickel plate;
   palladium plate;
   silver plate;
   rhodium plate;
   nickel plate;
   high phosphorous nickel plate;
   mid phosphorous nickel plating;
   sulfamate; and
   gold plating.

10. The contact probe of claim 1, wherein the plunger is fabricated from one or more of the following:
    nickel-silver;
    brass;
    beryllium copper;
    gold over nickel plate;
    palladium plate;
    silver plate;
    rhodium plate;
    nickel plate;
    high phosphorous nickel plate;
    mid phosphorous nickel plating;
    sulfamate; and
    gold plating.

11. A method of preventing contaminants from entering a contact probe, the method comprising:
    placing the contact probe in contact with a contact surface, wherein the contact probe comprises a barrel, a spring, a cap comprising an o-ring, wherein the cap is configured to interconnect with a first end of the barrel, a plunger placed within and extending through the first end of the barrel and the cap, and a ball located between the spring and the plunger; and applying a force to the contact probe such that the force causes the plunger to move into the barrel, whereby the o-ring prevents one or more contaminants from entering the barrel as the plunger moves into the barrel.

\* \* \* \* \*